(12) United States Patent  
Saini et al.

(10) Patent No.: US 7,480,430 B2  
(45) Date of Patent: Jan. 20, 2009

(54) PARTIAL CONFINEMENT PHOTONIC CRYSTAL WAVEGUIDES

(75) Inventors: Sajan Saini, Cambridge, MA (US); Jurgen Michel, Arlington, MA (US); Dong Pan, Andover, MA (US); Wojciech Giziewicz, Cambridge, MA (US); Lionel C. Kimerling, Concord, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 364 days.

(21) Appl. No.: 11/349,761

(22) Filed: Feb. 8, 2006

(65) Prior Publication Data

US 2007/0181915 A1     Aug. 9, 2007

(51) Int. Cl.  
*G02B 6/26* (2006.01)

(52) U.S. Cl. .......................... 385/39; 257/215

(58) Field of Classification Search ............. 385/39; 257/215  
See application file for complete search history.

(56) References Cited

U.S. PATENT DOCUMENTS

| | | | |
|---|---|---|---|
| 6,600,597 B2 * | 7/2003 | Beeson .................. 359/342 |
| 6,807,353 B1 | 10/2004 | Fleming et al. |
| 7,116,878 B2 * | 10/2006 | Zoorob et al. ........... 385/129 |
| 7,228,041 B2 * | 6/2007 | Kim et al. .............. 385/125 |
| 2003/0202764 A1 | 10/2003 | Lee et al. |
| 2004/0105645 A1 * | 6/2004 | Allan et al. ............. 385/129 |
| 2005/0232560 A1 * | 10/2005 | Knight et al. ........... 385/125 |
| 2005/0270633 A1 | 12/2005 | Herman et al. |
| 2006/0083472 A1 * | 4/2006 | Sakai et al. ............. 385/129 |
| 2006/0165360 A1 * | 7/2006 | Siegel et al. ............ 385/125 |
| 2006/0191566 A1 | 8/2006 | Schafsma |
| 2008/0050082 A1 * | 2/2008 | Mitomi et al. .......... 385/131 |
| 2008/0056656 A1 * | 3/2008 | Dong et al. ............. 385/125 |

OTHER PUBLICATIONS

Yi et al., "Developmental of New Si-based Waveguide: Photonic Crystal Cladded Waveguide," 2004 1st International Conference on Group IV Photonics, pp. 180-182.

Ibanescu et al., "An All-Dielectric Coaxial Waveguide" Science, vol. 289, Jul. 21, 2000, pp. 415-419.

Fink et al., "A Dielectric Omnidirectional Reflector" Science, vol. 282, Nov. 27, 1998, pp. 1679-1682.

Yi et al., "On-chip-Si-based Bragg cladding waveguide with high index contrast bilayers" Optics Express, vol. 12, No. 20, Oct. 4, 2004, pp. 4775-4780.

* cited by examiner

*Primary Examiner*—Ellen Kim  
(74) *Attorney, Agent, or Firm*—Gauthier & Connors LLP

(57) ABSTRACT

An optical waveguide structure includes an air-via region that receives an optical signal from an optical source. A photonic crystal cladding region is formed on the surface of the air-via region. The photonic crystal cladding region confines the optical signal within the air-via region and propagates the optical signal along the axial direction while ensuring near complete transmission of the optical signal.

27 Claims, 20 Drawing Sheets

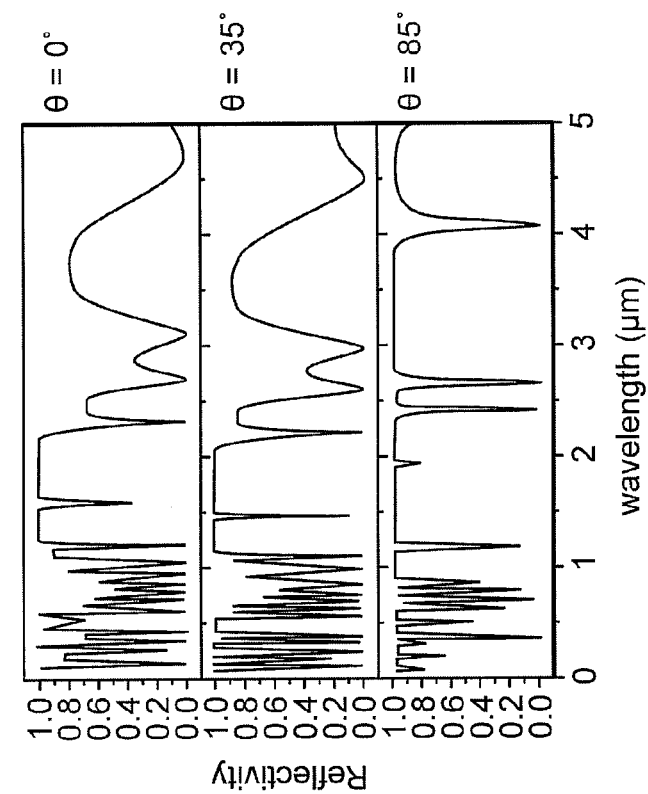
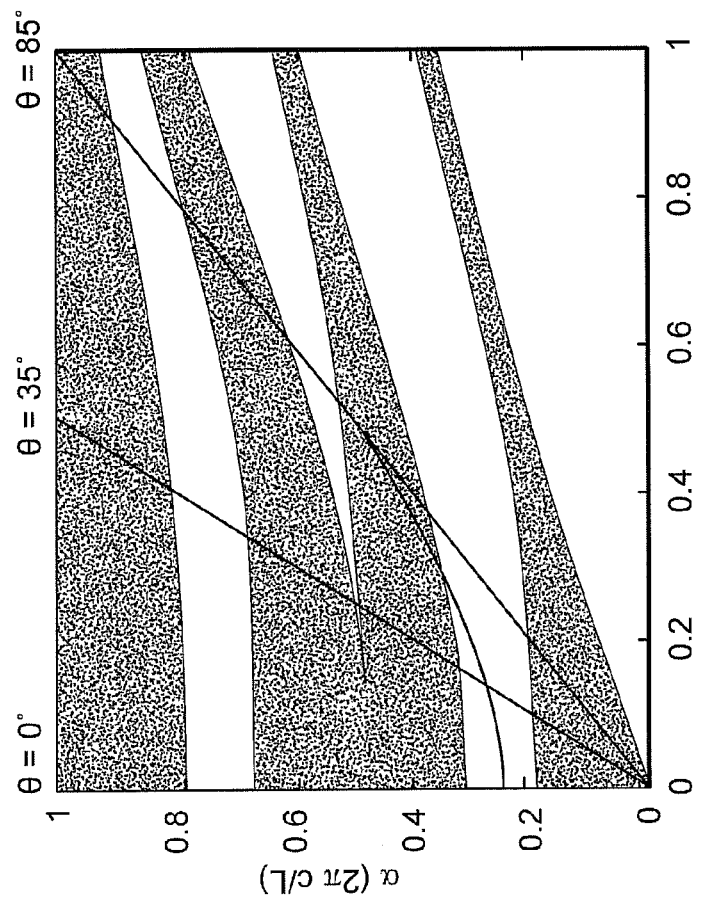
FIG. 1B
FIG. 1A

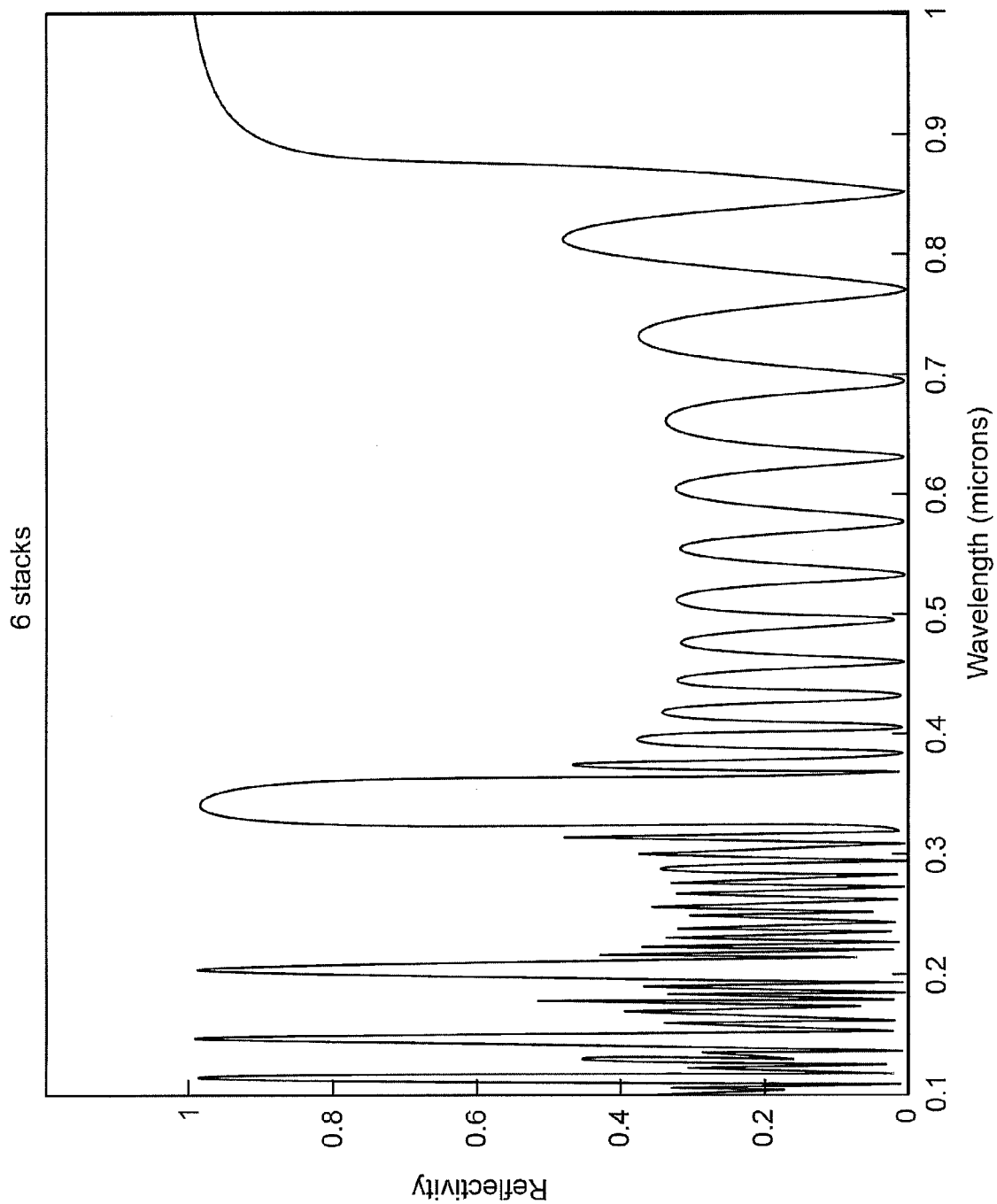

PARTIAL CONFINEMENT PHOTONIC CRYSTAL WAVEGUIDES

BACKGROUND OF THE INVENTION

The invention relates to the field of photonic crystal waveguides, and in particular to a monolithically integrated waveguide structure that confines and guides light emitted from a laser or LED light source mounted on the backside of a silicon (Si) wafer, without power loss due to Si materials absorption in the wafer.

Photonic crystal waveguides have been demonstrated in cylindrical geometry fibers and recently in planar waveguides, by employing the principal of omnidirectional reflection for wavelengths of light whose optical states lie fully within a photonic bandgap, as confined by the light-line of the propagating medium.

FIG. 1A shows the photonic band diagram of a one-dimensional (1-D) periodic photonic crystal, and its comparison in FIG. 1B with the angular reflectivity spectra of Bragg Gratings (Reflectors)—the historically popular name for 1-D photonic crystals. A photonic band diagram plots the allowed propagation constant $\beta$ values for different (angular) frequencies $\omega$ of light. These propagation constant values correspond to different angles of the light wavevector within the Bragg reflector structure. The (Fresnel) reflectivity spectrum of Bragg gratings have been studied extensively; the reflectivity stopband has been understood to be an interferometric effect based on the two refractive index materials comprising the Bragg grating, $n_1$ and $n_2$, having quarter-wavelength film thicknesses which are normalized with respect to refractive index: $t_1 = \lambda/4n_1$, $t_2 = \lambda/4n_2$. The combination of one $t_1$ and one $t_2$ layer are referred to as a Bragg pair of the grating.

The development of photonic crystal theory in the last fifteen years has arisen from the observation that the form of the Helmholtz equation for propagating modes of light is identical, to the form of the Schrodinger equation for propagating electron states. Analogous to the electron's conduction band states, valence band states, electronic bandgap and defect states within the bandgap, a periodic variation in refractive index modifies propagating modes of light to exist in either (1) low dielectric states (electric field intensity concentrated within the $n_1$ Bragg pair regions), (2) high dielectric states (electric field intensity concentrated within the $n_2$ Bragg pair regions), (3) a prohibited range of light frequencies referred to as the optical or photonic bandgap, and (4) defect layers of material that localize electric field distributions for light frequencies with propagation constant values lying within the photonic bandgap.

The photonic bandgap was immediately recognized to be the reflectivity stopband of Bragg reflectors. FIG. 1B shows how the reflectivity of a Bragg grating, for a given angle, can now be more generally understood as a straight line trajectory, with a given slope, on the photonic band diagram in FIG. 1A. This more generalized understanding of the Bragg interference phenomena shortly gave rise to a very important conclusion: a Bragg grating could reflect light incident from all angles in air, without the requirement that that there be a complete photonic bandgap, at the wavelength of interest.

Wavelengths of light incident from air onto the Bragg grating, or equivalently, the 1-D photonic crystal, will transmit into the structure only if there exist propagating modes within the light-line. The light-line is a line whose slope corresponds to the speed of light divided by the refractive index of the incident medium—in this case, air with n=1.0. For wavelengths at which there exists only the photonic bandgap, within the light-line, transmission into the structure will be prohibited. Hence an omni-directional reflector can be built using Bragg reflector materials $n_1$ and $n_2$, which otherwise do not possess a complete photonic bandgap.

An omni-directional reflector could be folded about itself to contain an air gap, or guiding defect layer, thus creating a coaxial structure which could trap light within the air gap and guide it along the axial direction. This new type of waveguide follows light propagation physics that differs from the total internal reflection based physics of conventional fiber optics and planar waveguides.

SUMMARY OF THE INVENTION

According to one aspect of the invention, there is provided an optical waveguide structure, which includes an air via region that receives an optical signal from an optical source. A photonic crystal cladding region is formed on the surface of the air via region. The photonic crystal cladding region confines the optical signal within the air via region and propagates the optical signal along the axial direction while ensuring near complete transmission of the optical signal.

According to another aspect of the invention, there is provided a monolithical optical structure, which includes a waveguide structure. A waveguide structure includes an air via region that receives an optical signal from an optical source. A photonic crystal cladding region is formed on the surface of the air via region. The photonic crystal cladding region confines the optical signal within the air via region and propagates the optical signal along the axial direction while ensuring near complete transmission of the optical signal.

According to another aspect of the invention, there is provided a method of forming an optical waveguide structure, which forming an air via region that receives an optical signal from an optical source. Also, the method includes forming a photonic crystal cladding region on the surface of the air via region. The photonic crystal cladding region confines the optical signal within the air via region and propagates the optical signal along the axial direction while ensuring near complete transmission of the optical signal.

BRIEF DESCRIPTION OF THE DRAWINGS

FIGS. 1A and 1B are graphs showing a photonic band diagram of a 1-D photonic crystals and the reflectivity spectra of a Bragg grating/reflector at different incidence angles; these incident angles correspond to linear trajectories across the photonic band diagram of a 1-D photonic crystal;

FIGS. 4A-4D are graphs illustrating TE and TM photonic band diagrams for the nominally designed structure;

DETAILED DESCRIPTION OF THE INVENTION

The invention is a monolithically integrated waveguide structure, which can simultaneously (1) optically isolate a λ=850 nm light signal inside an air-via (waveguiding the light from the IC chip wafer backside to the chip frontside while minimizing the amount of signal power absorbed by the Si substrate) and (2) deliver near 100% endpoint transmission of the light signal to a POF or single mode fiber optic or multimode fiber optic on the IC frontside. The invention can be more generally designed to optically isolate any wavelength of interest (such as λ=1550 nm for example, a wavelength of particular interest to optical interconnect applications); for our particular application, light emission into a POF 12 or single mode fiber optic or multimode fiber optic, we will consider a spectral wavelength range between λ=640-860 nm which is compatible with low POF or single mode fiber optic or multimode fiber optic transmission. We will present a specific design for a λ=850 nm VCSEL light source.

The invention can be more generally designed to deliver near 100% endpoint transmission to an arbitrary structure on the IC frontside, such as a lens collection system or even freespace transmission. For our particular application, we will consider endpoint transmission into a POF or single mode fiber optic or multimode fiber optic on the IC frontside.

Figure 2A:
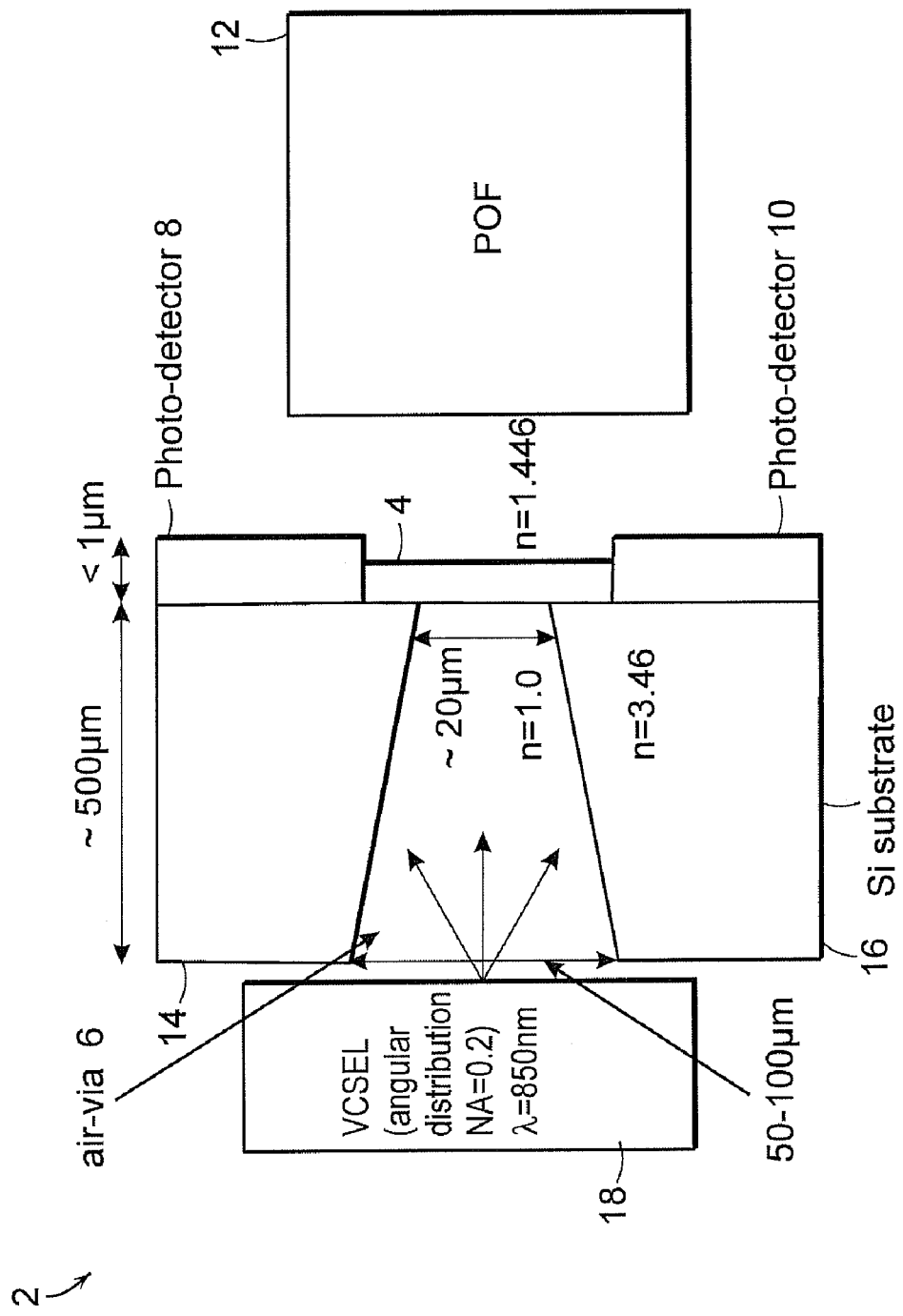
FIG. 2A is a schematic diagram of an air-via design for wafer backside integration of a POF or single mode fiber optic or multimode fiber optic guided light source ($\lambda$=850 nm) with an IC chip frontside.

Most frontsides of a high-speed IC chip 2 include a $SiO_2$ layer 4, as shown in FIG. 2A. The terminating end of the deep-RIE air-via 6 therefore opens to the underside of a $SiO_2$ insulator layer 4. Photodetectors 8, 10 receive an incoming signal from a POF 12 or single mode fiber optic or multimode fiber optic. The sidewalls 14, 16 of deep-RIE air-via 6 comprise Si. On the backside of the high IC chip 2 is a VCSEL providing an optical signal to the air-via 6. The invention can be generally designed to transmit light through an air-via of any arbitrary size; for our particular application, the air-via has been designed to be a tapered cylindrical hole, varying in diameter size from 70 μm to 20 μm.

A conventional waveguide can confine and guide light along a high refractive index ($n_2$) core material, surrounded by a lower refractive index ($n_1$) cladding material. Amongst the materials systems utilized in Si CMOS-compatible processing, Si and Germanium (Ge) have the two highest refractive indices. At λ=850 nm, Ge has a refractive index of 4, a higher value than the refractive index of Si (3.5); however, λ=850 nm corresponds to a photon energy above the bandgap of Ge, and the bandgap of Si. If a light signal is to be guided from the backside of a Si wafer to the frontside with negligible absorption loss, an alternate waveguiding mechanism is required.

A photonic crystal waveguide optically confines and guides a λ=850 nm light signal with an exponential decay of signal power into a Si substrate. Given that λ=850 nm is a photon with energy larger than the bandgap of Si, is it imperative to strongly confine the light signal away from the Si substrate—i.e., to effectively isolate the light signal within the air-via. The exponential decay of light outside the Bragg cladding of a photonic crystal waveguide helps insure this requirement. If a significant amount of the λ=850 nm light signal were absorbed into the Si substrate, the photo-generated excess electron-hole pairs would create a background noise current degrading IC performance and potential crosstalk to the photodetectors 8, 10 that receive an incoming signal from the plastic optical fiber POF 12 or single mode fiber optic or multimode fiber optic.

Figure 2B:
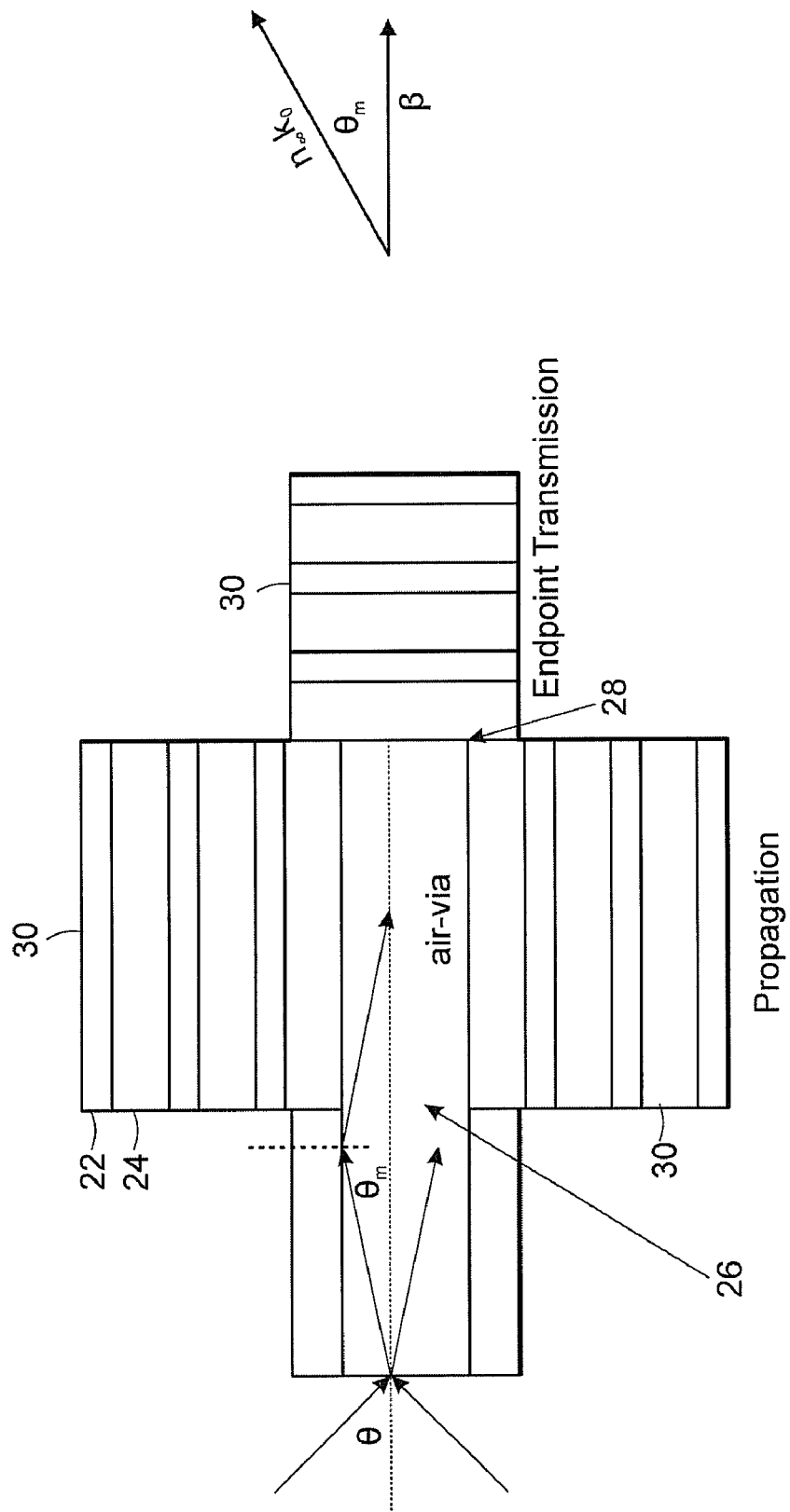
FIG. 2B is a schematic diagram illustrating a monolithically integrated partial confinement photonic crystal waveguide.

With a photonic crystal waveguide 30, periodic layers of silicon oxynitride (SiON), silicon nitride ($Si_3N_4$) 22 and silicon oxide ($SiO_2$) 24 can be deposited as a Bragg reflector, or 1-D photonic crystal, conformally covering the surface of a deep-reactive ion etched (RIE) air-via 26, as shown in FIG. 2B. The resulting inventive structure will confine the λ=850 nm light signal within an air defect or air-via 26 and propagate the signal along the axial direction. The periodic $SiON/SiO_2$ or $Si_3N_4/SiO_2$ pairs 30 will here onwards be referred to as the Bragg cladding 30. The inventive structure can be more generally composed of any two materials where the first material has a higher refractive than the second material; the two materials can be either insulator (ceramic or polymer), semiconductor or metal materials class. For our particular application, we will make use of the $SiON/SiO_2$ or $Si_3N_4/SiO_2$ Bragg cladding 30 system.

Conformal coverage of the air-via's surface by the Bragg cladding 30 would also cover the air-via terminating end 28. The same principal of omnidirectional reflectivity which isolates the λ=850 nm light signal to the air-via 26 will also impede endpoint transmission, defined here as the transmission of λ=850 nm light from the air-via 26, through the Bragg cladding 30 and into the $SiO_2$ frontside. This design will create a high insertion loss into the POF 12 or single mode fiber optic or multimode fiber optic.

However, the modified photonic crystal waveguide design of the invention, which illustrates a partial confinement photonic crystal waveguide, can simultaneously isolate and guide the λ=850 nm light signal through the air-via 26 while ensuring near-100% endpoint transmission into a POF 12 or single mode fiber optic or multimode fiber optic.

As FIG. 2B indicates, the propagation constant β corresponds to the horizontal projection of the light signal wavevector (of magnitude $k_0$), i.e.

$$\beta = k_0 \cos\theta, \qquad \text{Eq. 1}$$

where θ is the angle the wavevector makes with the horizontal axis. The numerical aperture NA of a waveguide or light-source describes the maximum angular spread of light wavevectors about the horizontal axis, and is defined $$NA = \sin\theta. \qquad \text{Eq. 2}$$

In the example case, the light source has a numerical aperture of NA=0.2 at λ=850 nm, therefore the isolation and guiding of this light signal along the air-via 26 requires photonic crystal waveguide based confinement only for the range of propagation constants, $\beta = k_0 \rightarrow k_0 \cos(\sin^{-1}(0.2))$, corresponding to the NA range NA=0→0.2. This range of β-values have been labeled in FIG. 3 for TE modes, where one see that a waveguide design is possible for which this range of β lie within the photonic bandgap, while a range of β-values close to β=0, lie within the low dielectric band.

One can define such a waveguide, which guides and confines only a partial range of β-values, for a given wavelength of light λ (in this particular case λ=850 nm), as the partial confinement photonic crystal waveguide.

Figure 3:
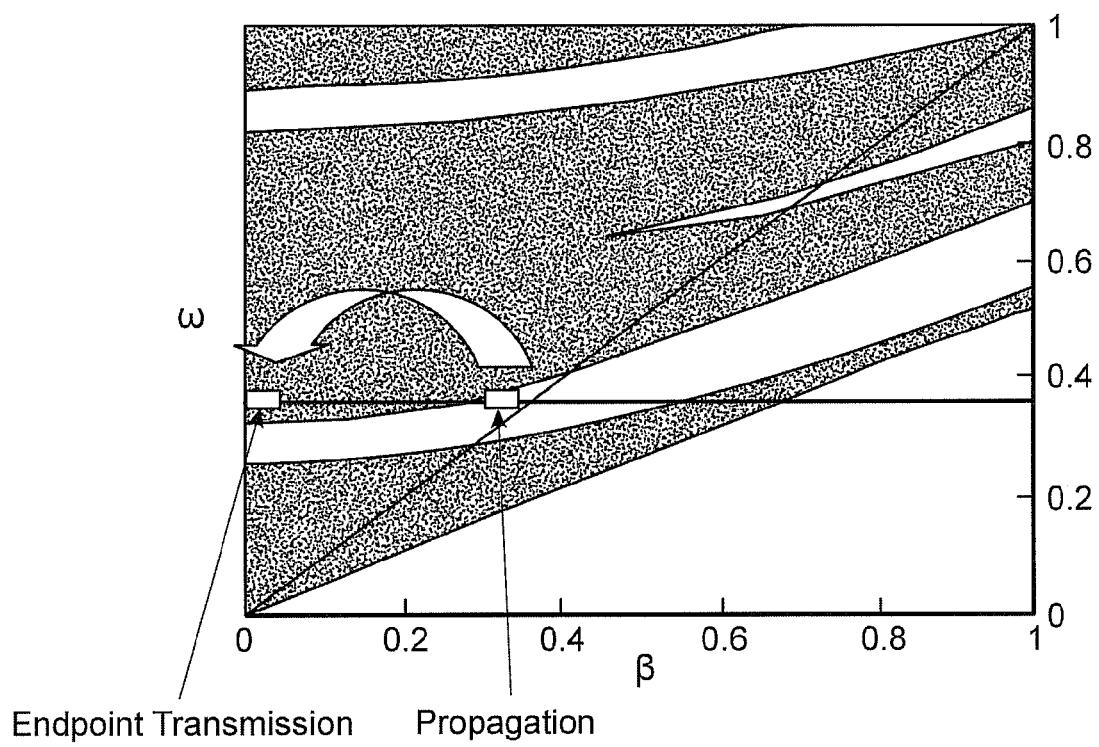
FIG. 3 is a photonic band diagram demonstrating the geometric rotation of the partial confinement photonic crystal waveguide by 90° at the terminating end of the air-via.

If the POF or single mode fiber optic or multimode fiber optic light signal λ=850 nm travels along such a partial confinement photonic crystal waveguide—specifically, the 20-70 μm diameter air-via, conformally covered with an $SiON/SiO_2$ or $Si_3N_4/SiO_2$ Bragg cladding, whose thickness match with the structure in the photonic band diagram of FIG. 3—one can observe a crucial effect at the terminating end of the air-via 26: near 100% transmission of the signal into the SiO$_2$ frontside.

As FIG. 3 indicates, waveguiding signals (with propagation constant β) incident on the terminating end of the air-via will optically interact with a Bragg cladding geometry which is orthogonal to the Bragg cladding which coats the 500 μm length of air-via. Rotating the geometry by 90° in this manner is akin to re-assigning new propagation constant values β' to the light signal, with respect to the Bragg reflector coating the terminating end:

$$(\beta')^2 = k_0^2 - \beta^2. \qquad \text{Eq. 3}$$

On the photonic band diagram in FIG. 3, one can see this re-mapping of propagation constants from large β-values to small β'-values results in a transformation from states lying within the photonic bandgap to states lying within the low dielectric band. At the terminating end of the air via, the 90° rotation of a partial confinement photonic crystal waveguide transforms the structure from an optically isolating and guiding device into a transmission device. The partial confinement photonic crystal waveguide is therefore a monolithic integration compatible structure which can simultaneously guide a λ=850 nm light signal and provide endpoint transmission into the POF or single mode fiber optic or multimode fiber optic.

Typical etch patterns for air-vias in this project have been of cyclindrical symmetry: 1-D structures are examined for both TE and TM modes of light, in order to design a structure which accommodates arbitrary light signal polarization.

Photonic band diagrams describe the optical properties of light interacting with Bragg grating structures which are infinitely long. In practice, a finite number of SiON/SiO$_2$ or Si$_3$N$_4$/SiO$_2$ pairs will be conformally deposited within the etched air-via. In order to finalize the inventive design a more accurate characterization of photonic crystal waveguide propagation and endpoint transmission is done by studying the TE and TM reflectivity properties of finite-pair Bragg claddings in FIG. 4, FIG. 7 and FIG. 8.

Unlike the total internal reflection-based confinement properties of conventional waveguides, which imply a theoretically lossless propagation of light along the high refractive index waveguide core, the less-than-unity reflectivity of photonic crystal waveguides imply the presence of a theoretical propagation loss, per unit length, which reduces with more Bragg reflector pairs.

The higher the refractive index contrast between the two Bragg pair materials, the fewer pairs are required to achieve a given amount of reflectivity, which corresponds in turn to a given amount of waveguide propagation loss (dB/cm units).

The conformal-covering SiON/SiO$_2$ or Si$_3$N$_4$/SiO$_2$ Bragg pairs will be deposited within the air-via by a CVD process. One needs to determine what would be an acceptable number of Bragg pairs to deposit.

One nominal approach is to design a square wave profile with Bragg pairs comprised of alternating layers of Si$_3$N$_4$ ($n_2$=2.2) and SiO$_2$ ($n_1$=1.453) with layer thickness values modified from the quarter-wavelength condition ($t_1$=180 nm and $t_2$=115 nm), in order to have a partial confinement structure.

Figure 4A:
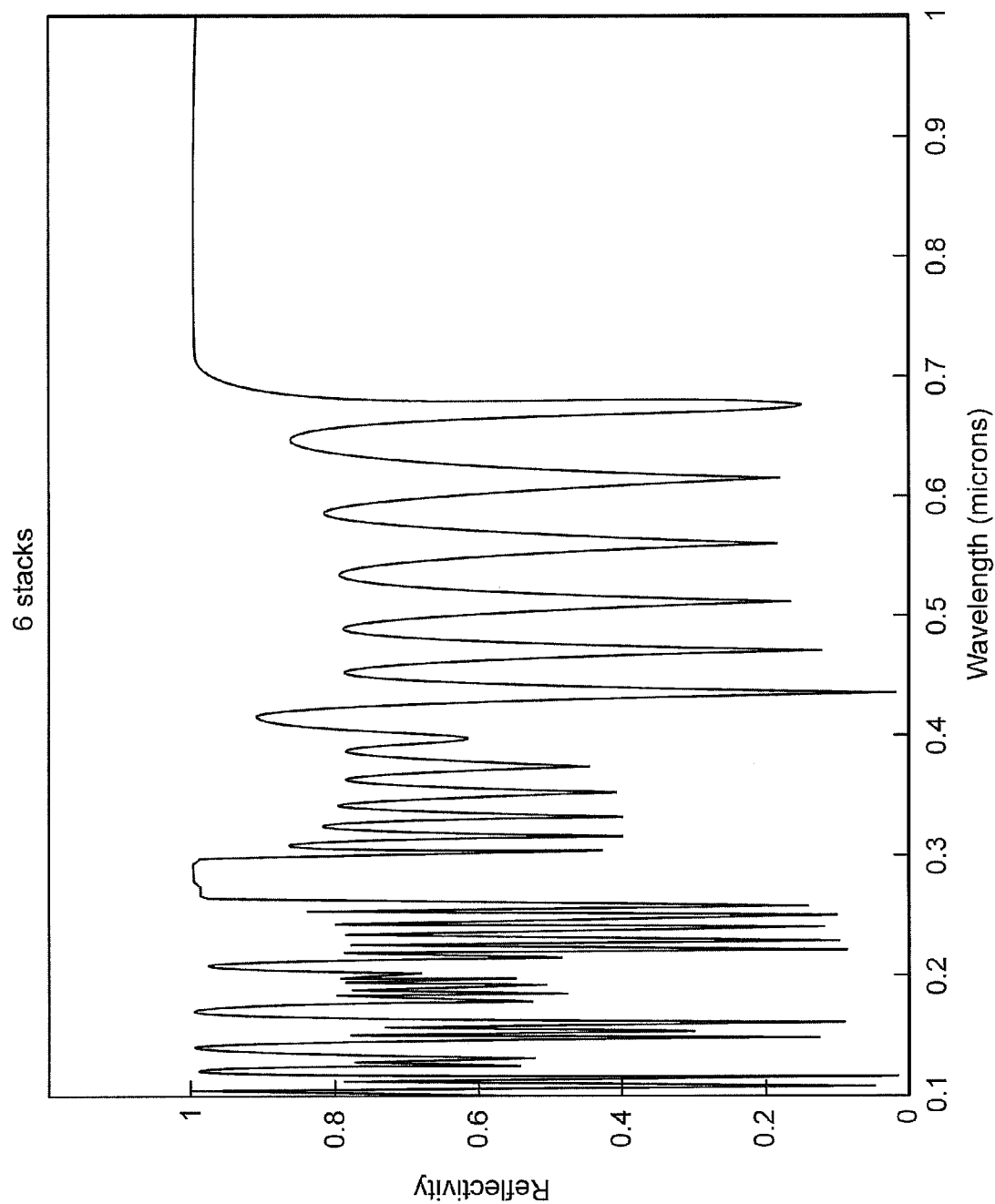
Figure 4B:
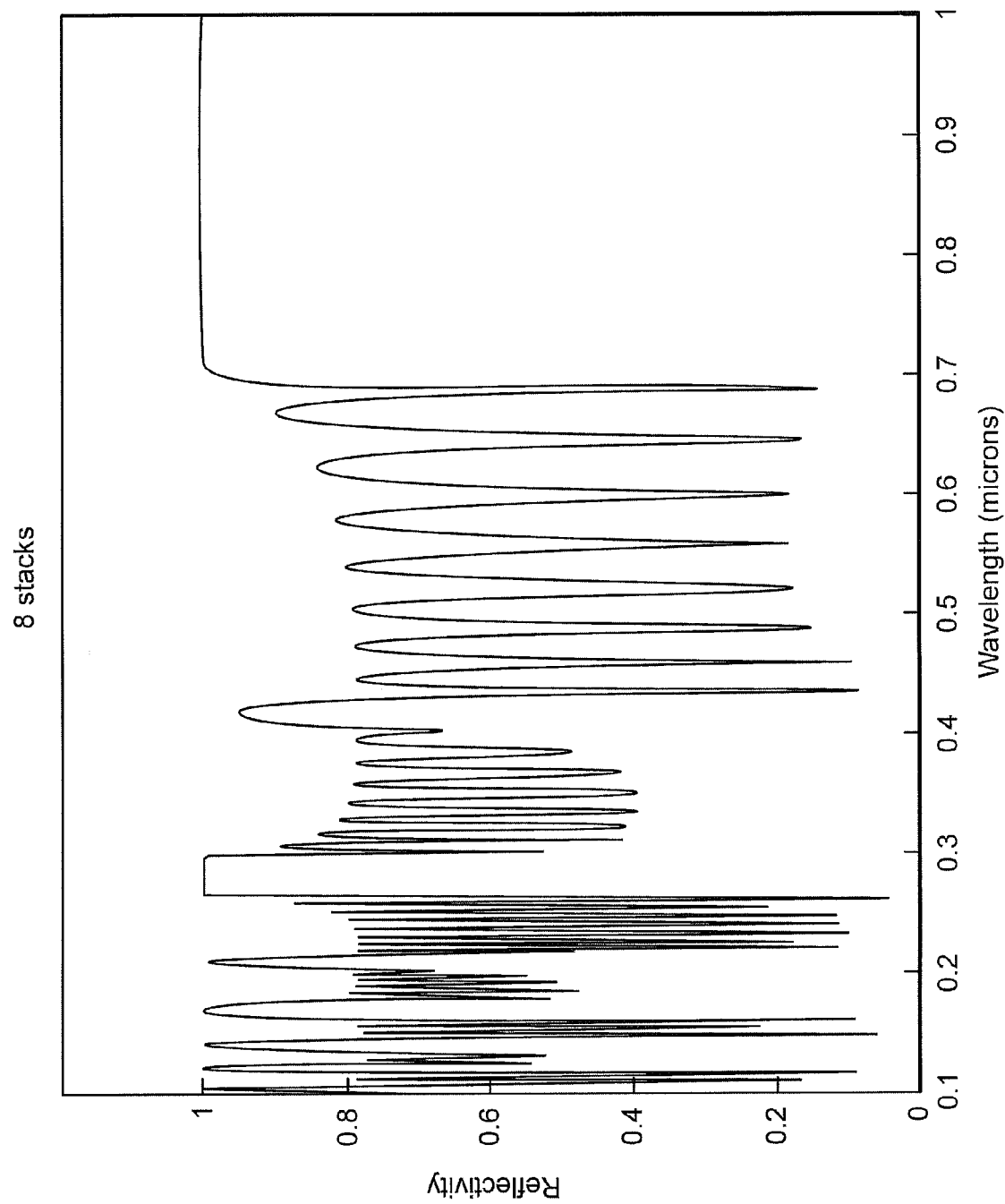

The VCSEL light source to be utilized in this POF or single mode fiber optic or multimode fiber optic link has a numerical aperture of NA=0.2, corresponding to a divergence angle of θ=11.54°. Along the length of the air-via, this implies that modes of propagating light will be incident on the Bragg reflector cladding at angles, with respect to the normal, ranging between θ=78.46°→90°. FIGS. 4A-4B show the TE reflectivity at θ=78.46° for 6 and 8 Si$_3$N$_4$/SiO$_2$ Bragg pairs.

Figure 5:
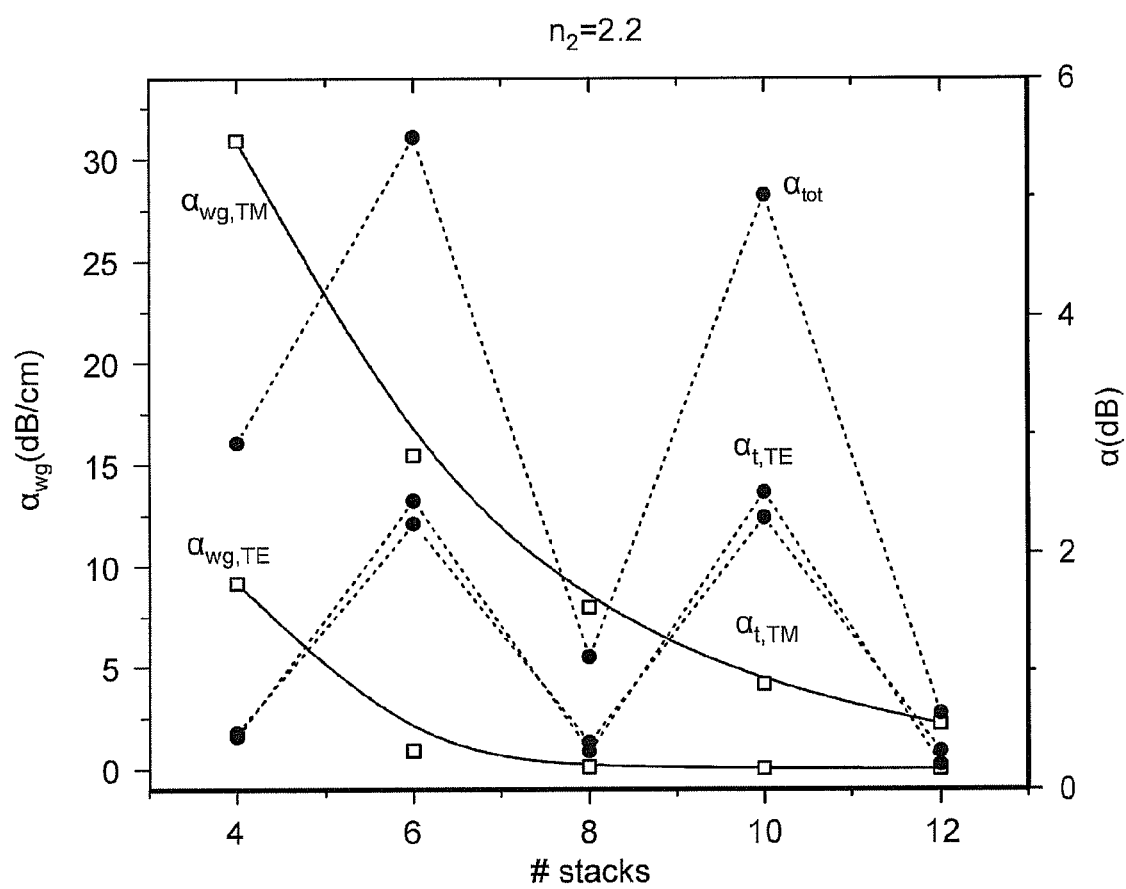
FIG. 5 is a graph demonstrating TE and TM mode propagation loss in dB/cm and endpoint transmission loss in dB as a function of the number of $SiON/SiO_2$ or $Si_3N_4/SiO_2$ pairs (stacks) making up the 1-D photonic crystal.

FIG. 5 summarizes these reflectivity values as a propagation losses α (dB/cm), versus #Bragg pairs. The relationship between reflectivity (for the light signal λ=850 nm) at an angle θ, $R_\theta$, and α is $$\alpha = \frac{1}{d} \sqrt{\left(\frac{1}{\cos\theta}\right)^2 - \ln\left(\frac{1}{R_\theta}\right)}. \qquad \text{Eq. 4}$$

One can observe that TM modes are considerably more lossy than TE modes, and that with 8 Bragg pairs one can achieve a propagation loss on the order of 10 dB/cm. Along an air-via of length 500 μm, this corresponds to a loss of 0.5 dB, i.e. a loss of 11% in power to the Si substrate as the light signal propagates along the air-via.

However, this square wave profile design cannot provide reliable endpoint transmission. A finite number of Bragg pairs results in a transition from photonic bandgap (or reflectivity stopband) to low dielectric bands (or reflectivity passband) which is not abrupt. Reflectivity sidelobes surround the stopband, as shown in FIGS. 4C-4D, which can not be controllably tailored, with the ~5% thickness error margin possible in CVD deposition.

Figure 4D:
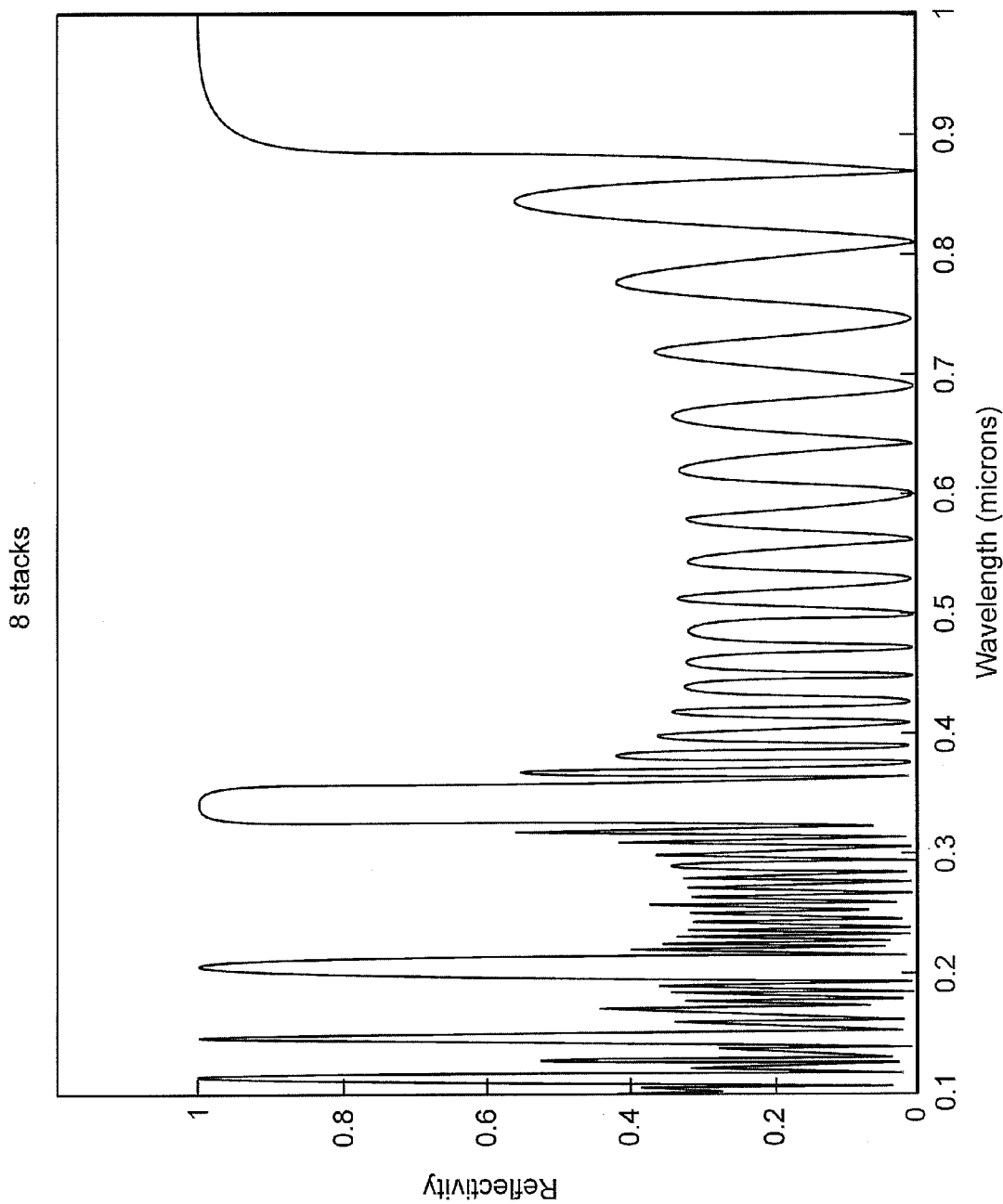

FIGS. 4C-4D show the reflectivity as seen by light wavevectors with the divergence angle θ=11.54° with respect to the horizontal (for TE and TM modes). One can observe that at the terminating end of the air-via, the reflectivity sidelobes for this incidence angle tend to create significant reflectance, potentially as high as 40-50%, at λ=850 nm. This is a large insertion loss into the POF or single mode fiber optic or multimode fiber optic, and an up to 50% reflection of power back into the VCSEL light source can cause potential laser degradation. A more robust design is needed which assures high endpoint transmission, subject to a 5% film thickness error margin for the Bragg pairs.

Figure 6B:
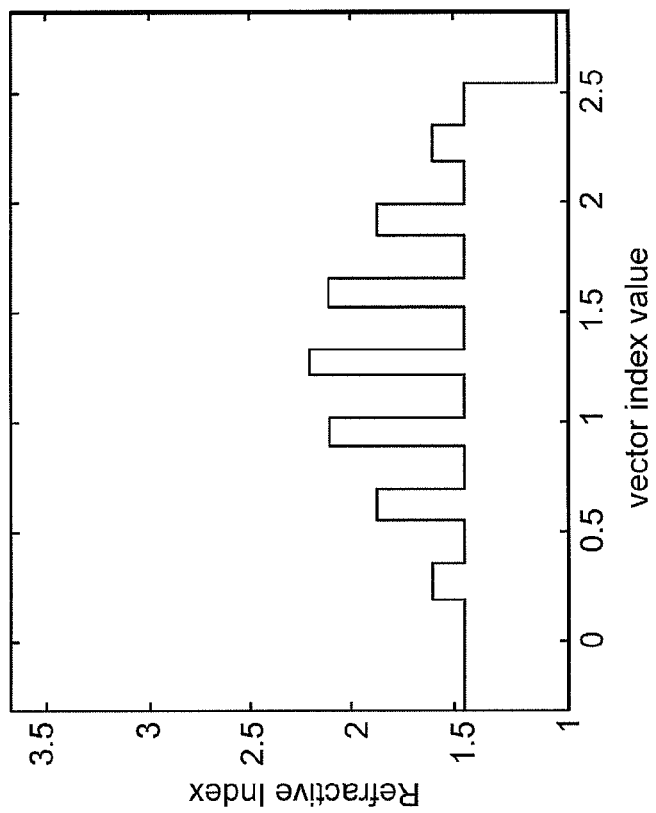
FIGS. 6A-6B is a graph demonstrating an apodized profile applied to a partial confinement photonic crystal waveguide.
Figure 6A:
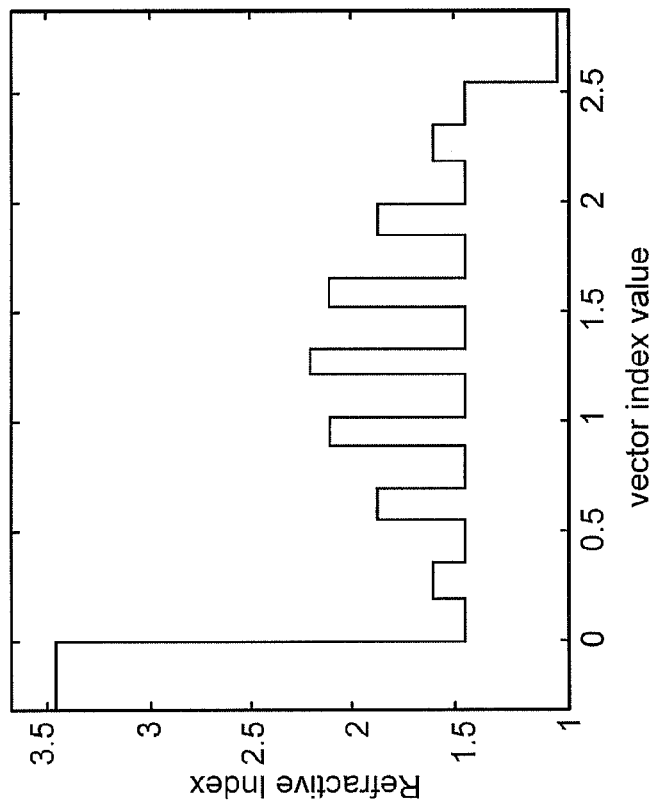
Figure 7A:
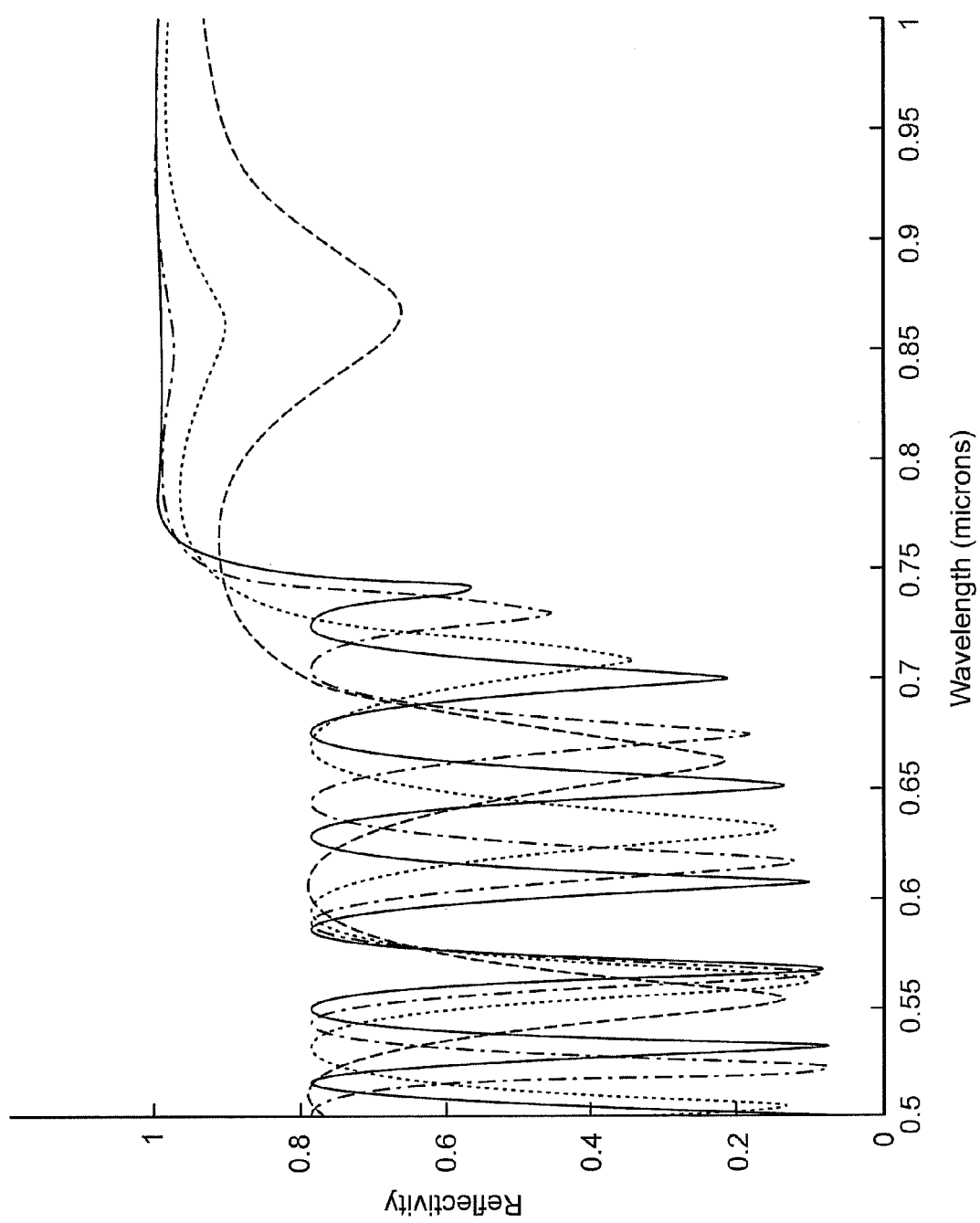
FIGS. 7A-7D are graphs demonstrating TE reflectivity from an apodized profile partial confinement photonic crystal waveguide.
Figure 7B:
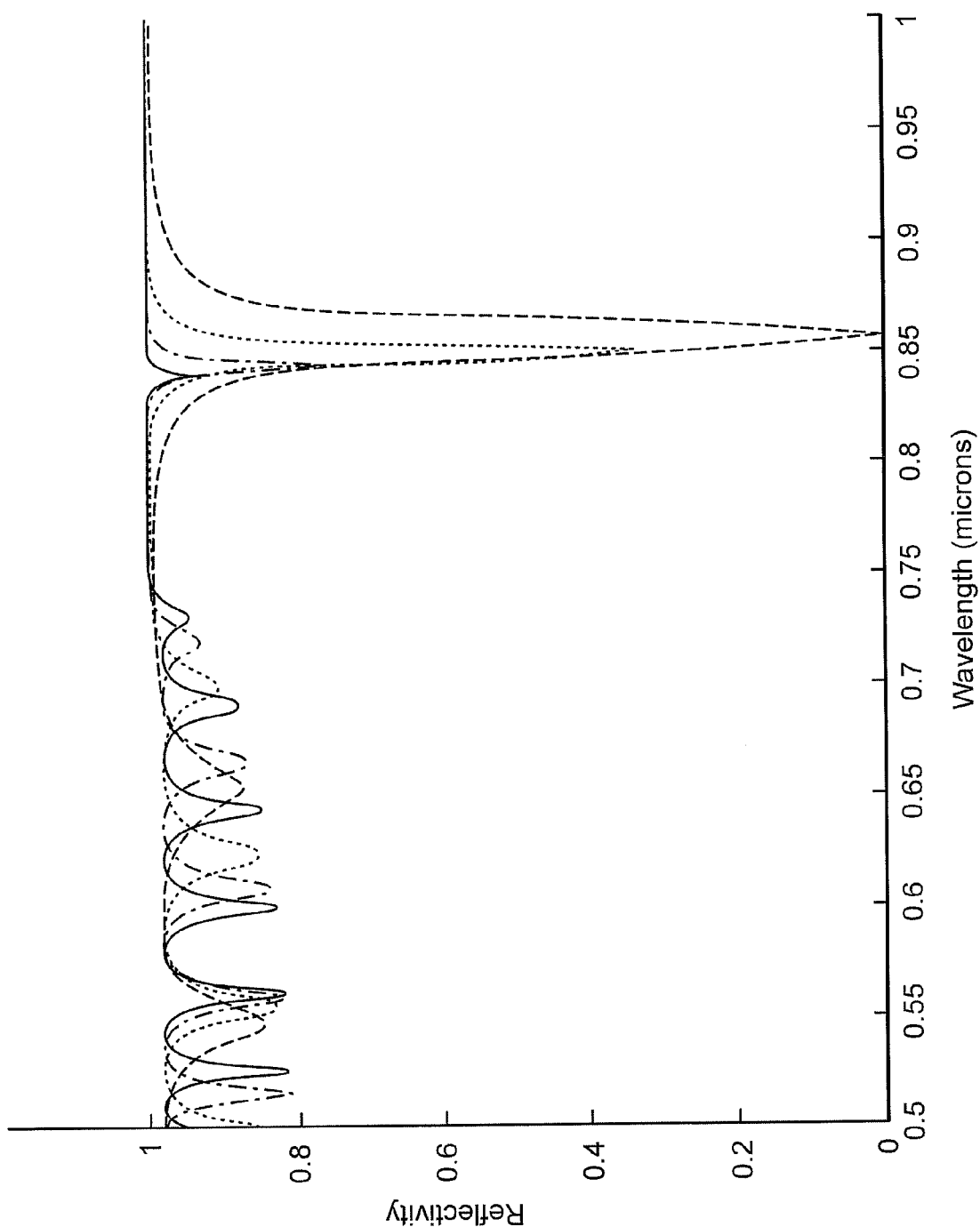
Figure 7C:
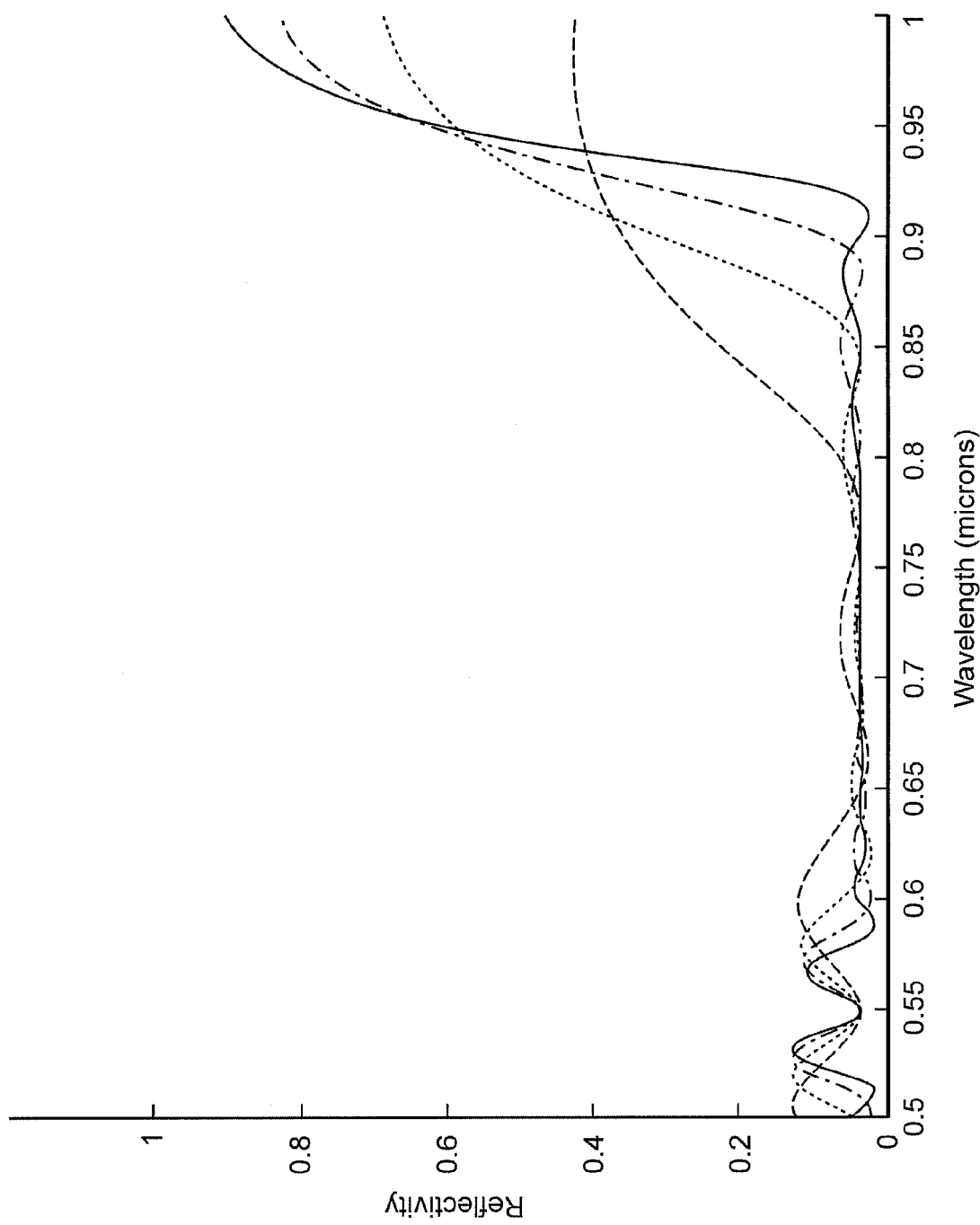
Figure 7D:
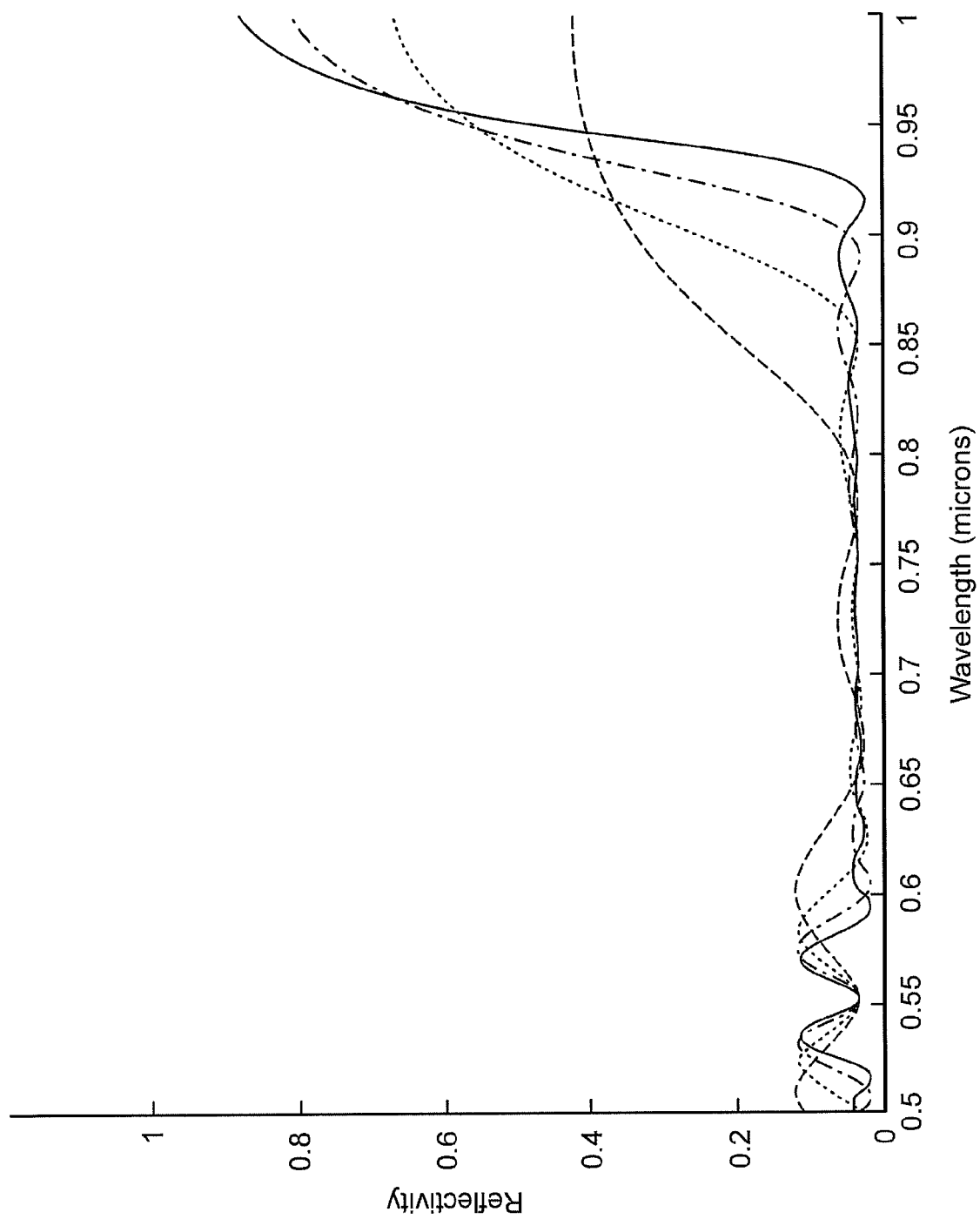
Figure 8A:
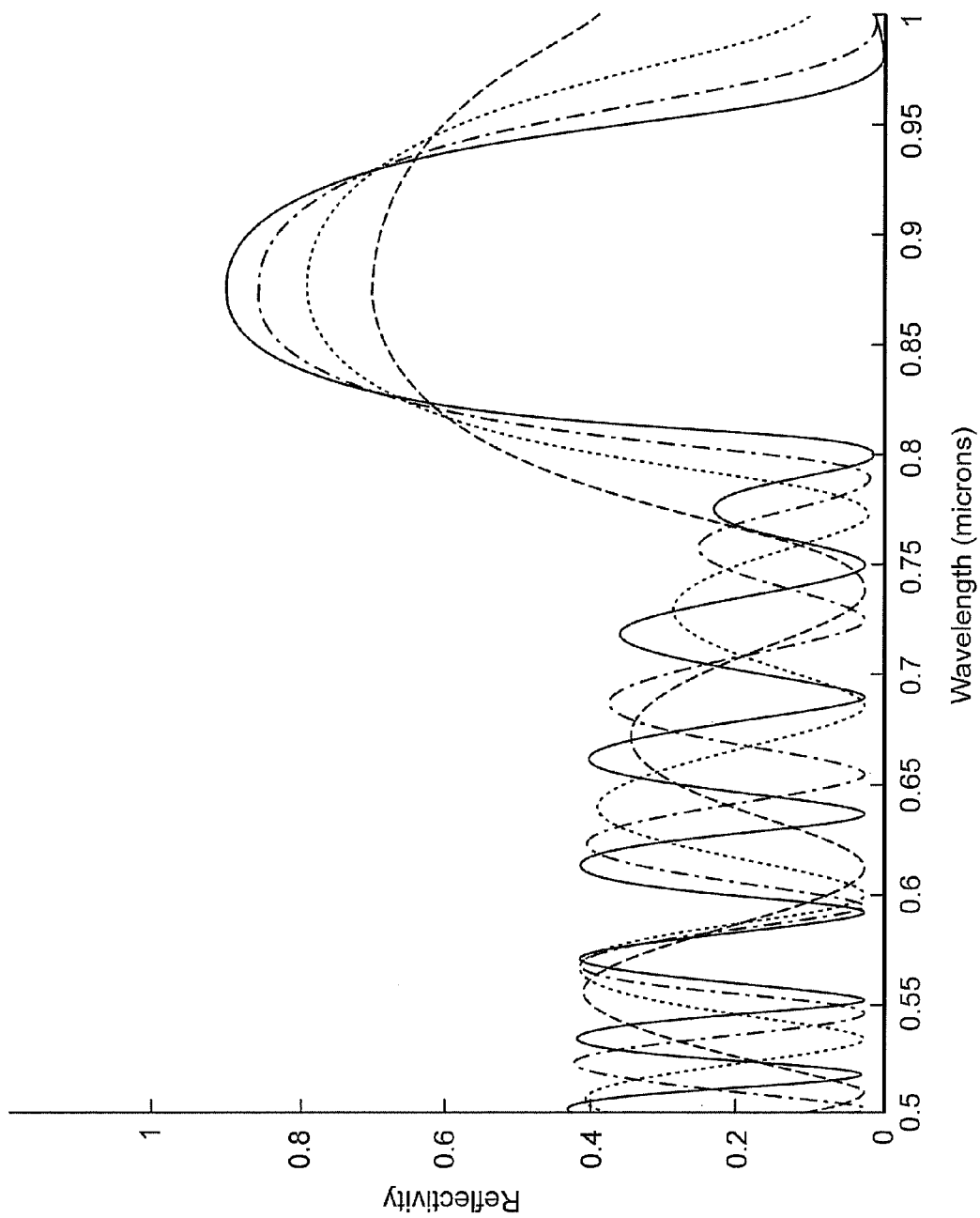
FIGS. 8A-8D are graphs demonstrating TM reflectivity from an apodized profile partial confinement photonic crystal waveguide.
Figure 8B:
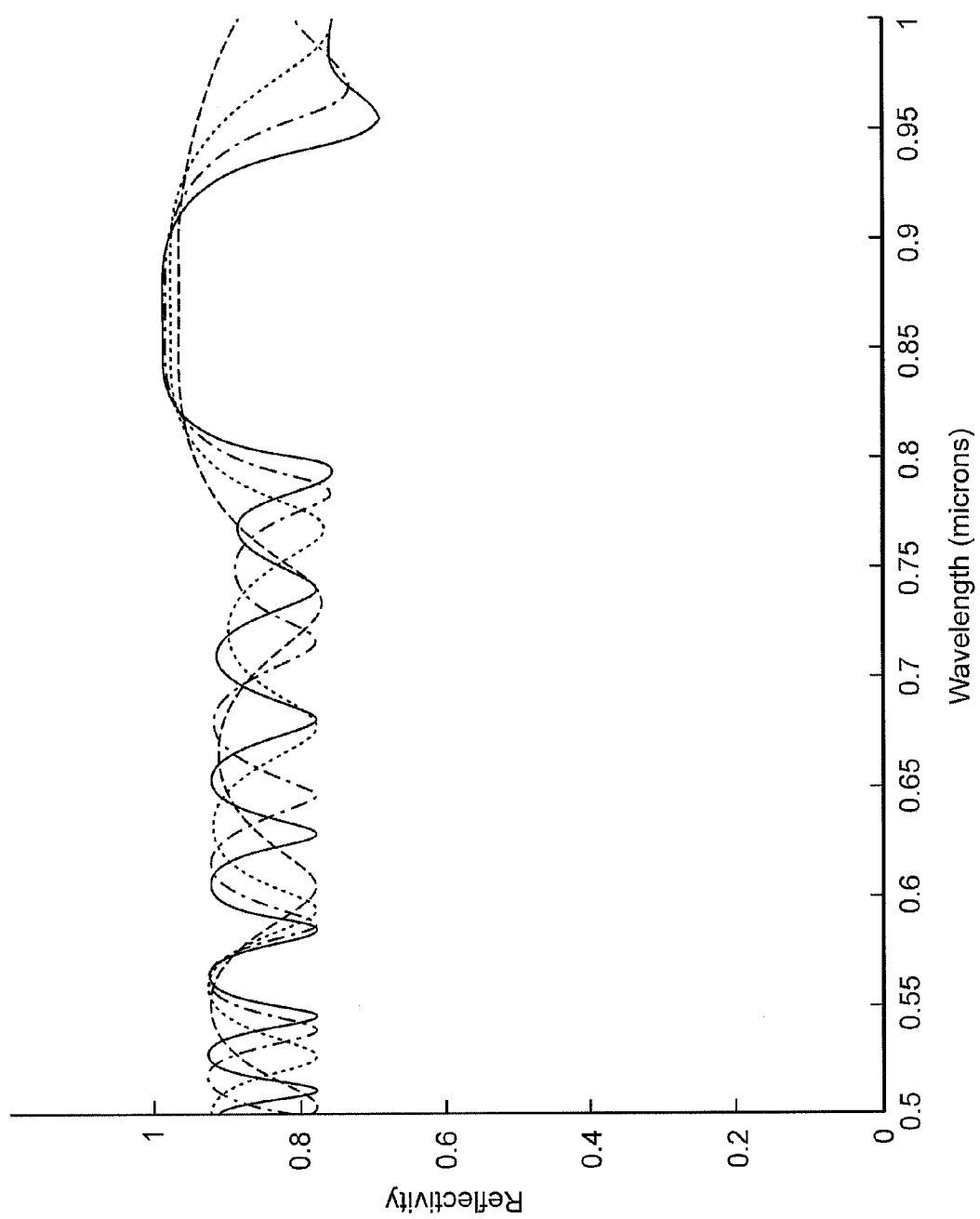
Figure 8C:
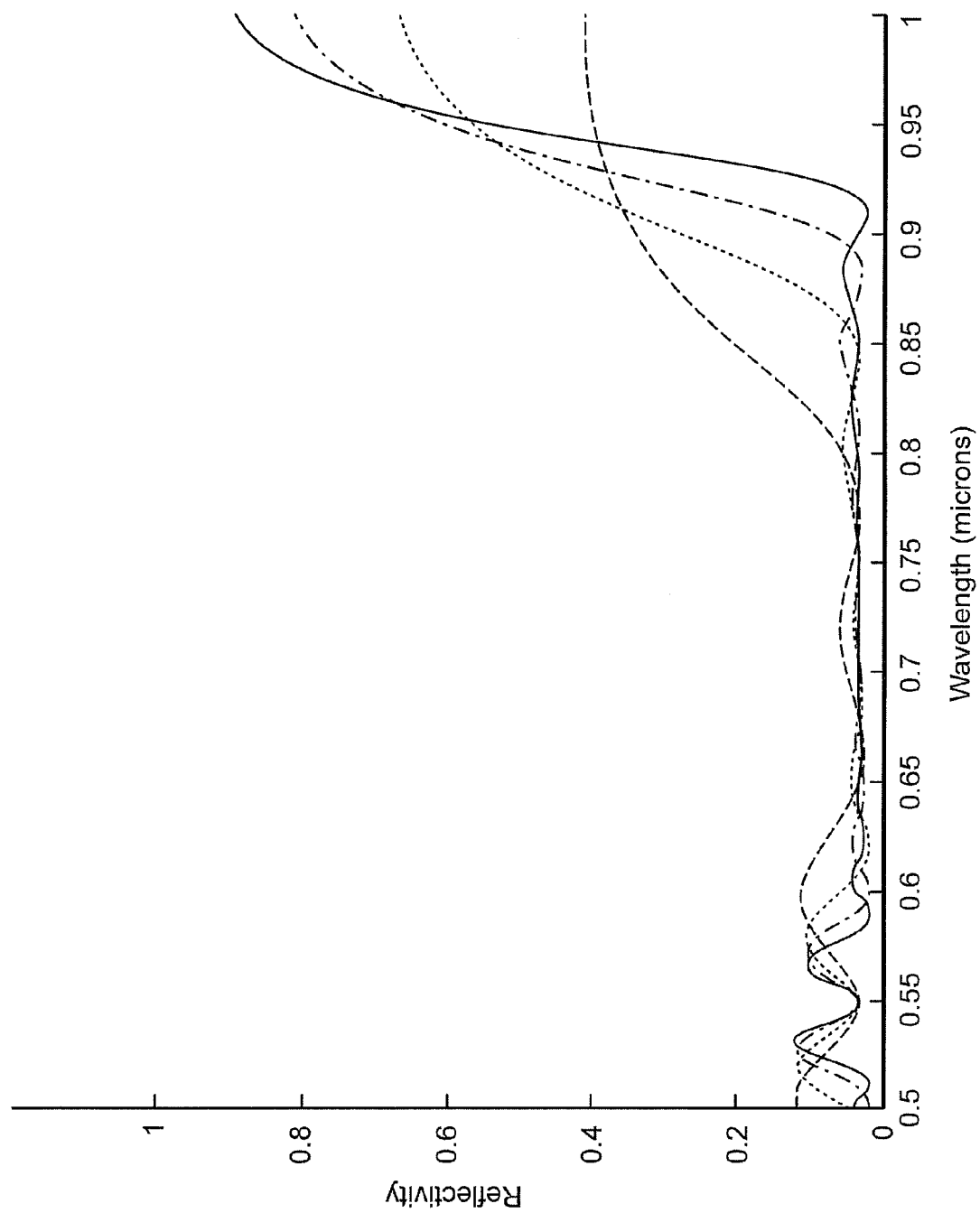
Figure 8D:
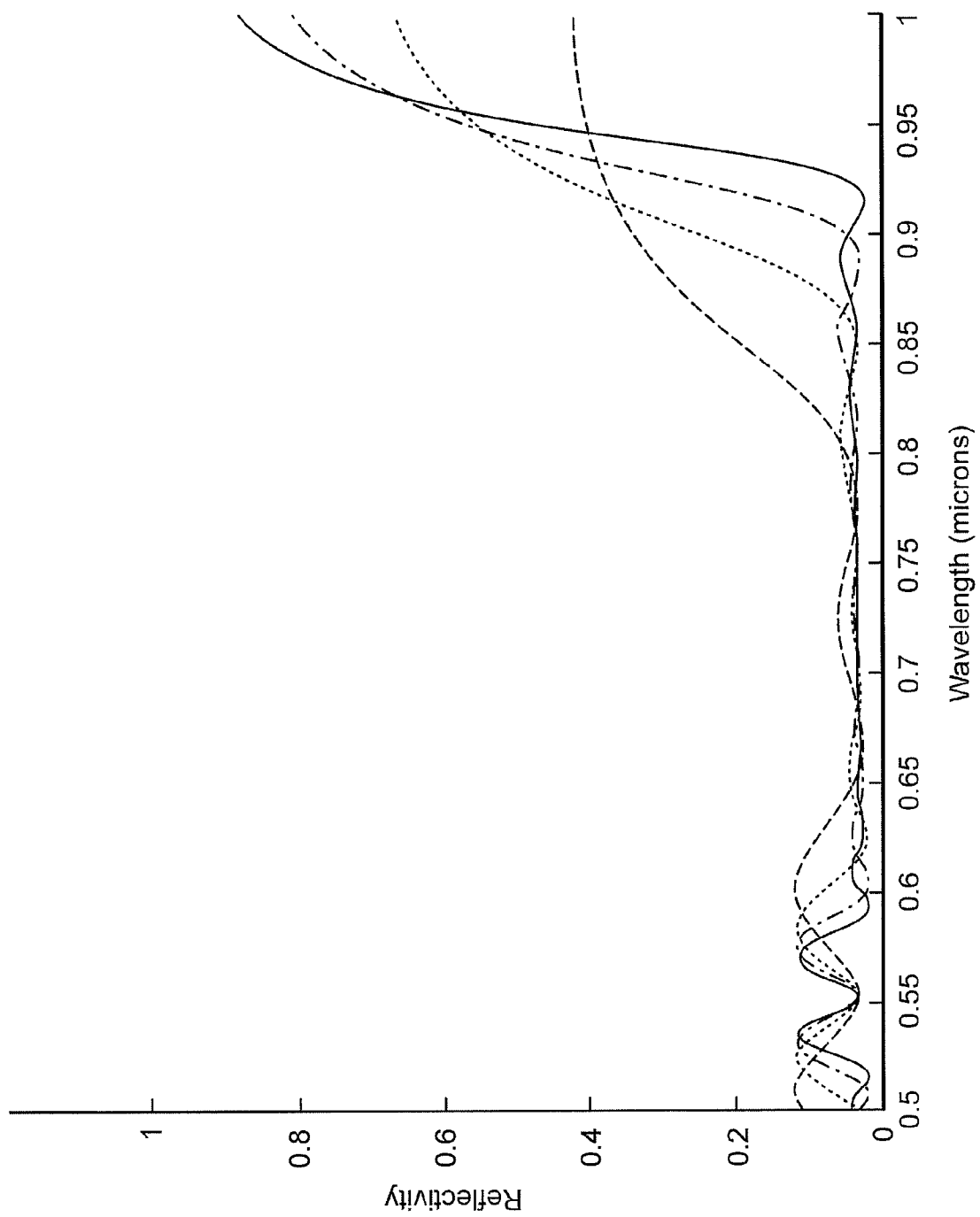
Figure 9B:
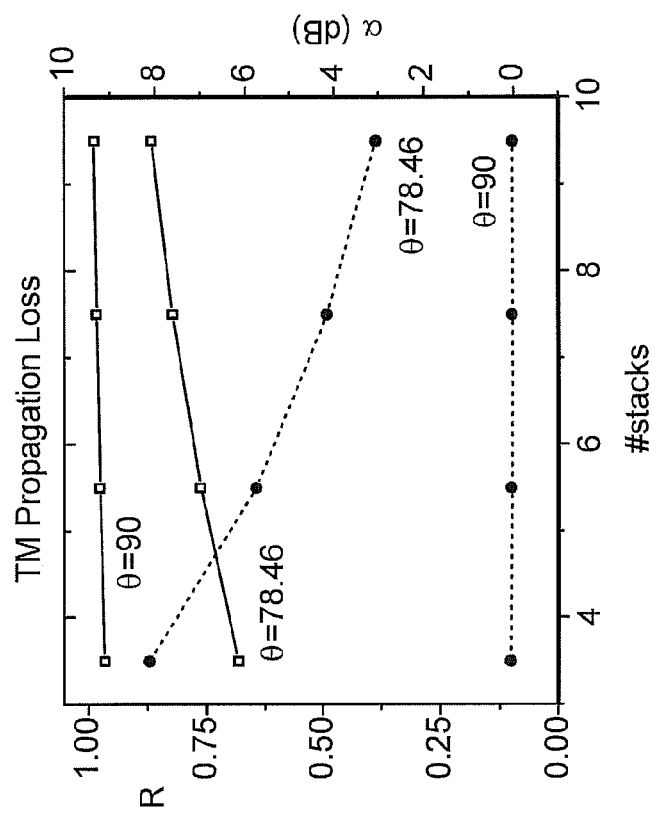
FIGS. 9A-9D are graphs demonstrating reflectivity and propagation loss after an air-via distance of 500 μm for the two incidence angles θ=78.46° and θ=90°.
Figure 9A:
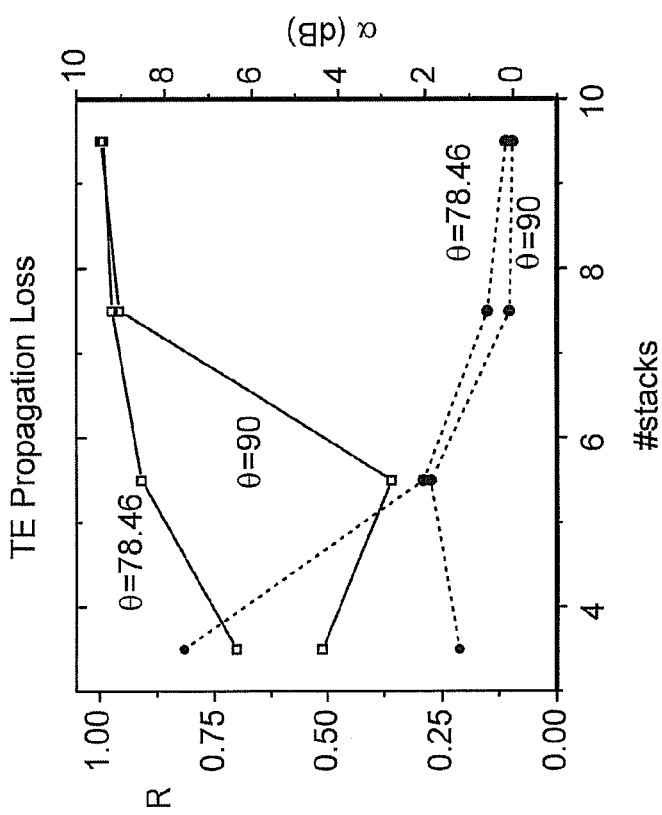
Figure 9D:
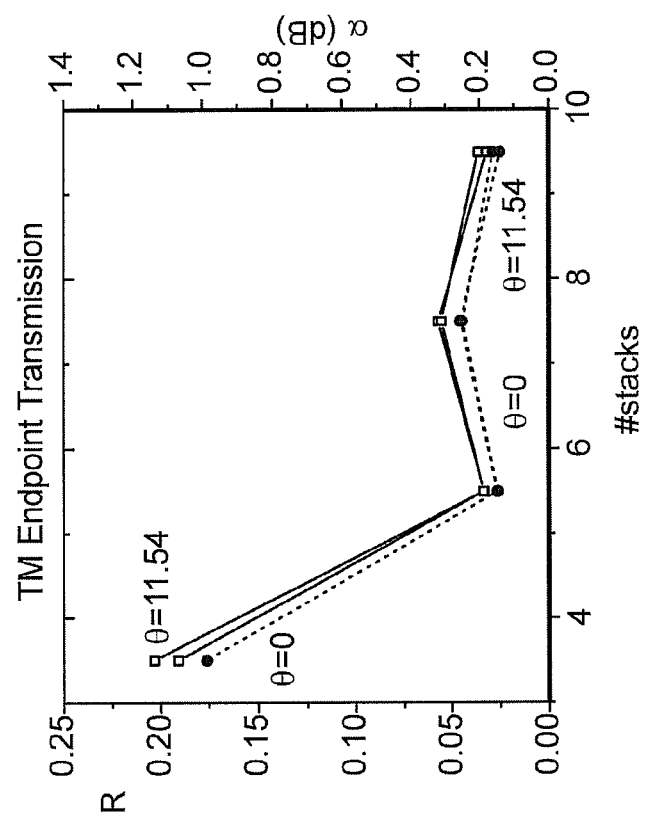
Figure 9C:
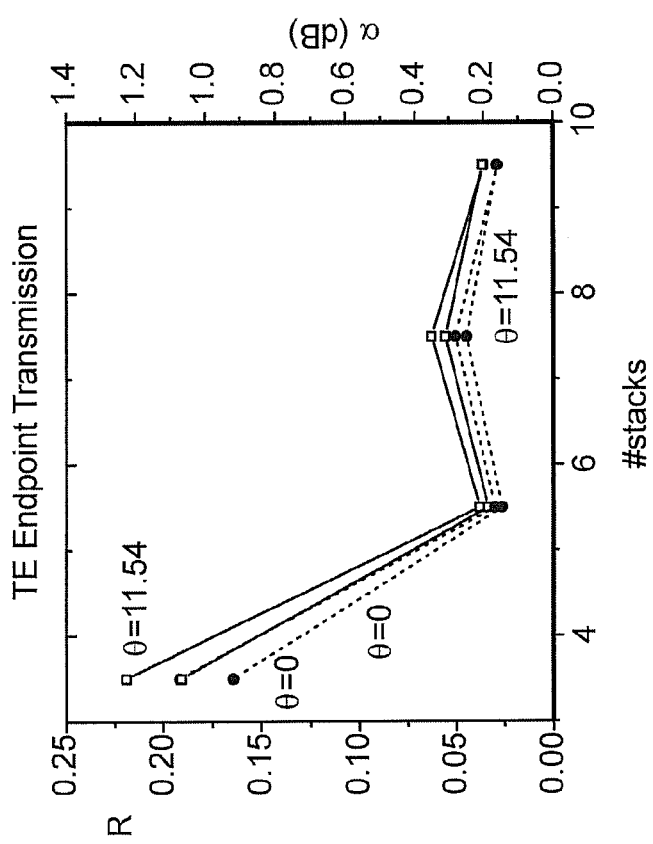

Apodization is a transmission processing design which imparts a slowly varying profile to a Bragg grating. The result has the effect of dramatically smoothening out reflectivity sidelobes, if the profile significantly weakens the grating strength near its edges. FIGS. 6A-6B shows the apodized profile applied to a partial confinement photonic crystal waveguide: the Si$_3$N$_4$ layers have been altered into silicon oxynitride (SiON) layers with refractive indices intermediate to Si$_3$N$_4$ and SiO$_2$. FIG. 6A shows an apodized profile for the partial confinement photonic crystal waveguide, conformally deposited on the Si sidewalls of the air-via for light signal isolation and propagation. FIG. 6B shows the an apodized profile for the partial confinement photonic crystal waveguide, conformally deposited on the oxide on the air-via terminating end, for endpoint transmission. Each SiON layer, with its given refractive index, has been designed to be a quarter wavelength thickness (normalized with respect to its refractive index value) for a wavelength $\lambda_{center}$ ('center' refers to this wavelength being at the center of the reflectivity stopband) slightly larger than λ=850 nm. The refractive index and film thicknesses of all the layers are summarized in Table 1.

FIGS. 7A-7B and FIGS. 8A-8B show the reflectivity spectrum as seen at θ=78.46° and θ=90° along the air-via, for TE and TM modes, respectively. These two θ-angles form the divergence boundary values for wavevectors of the λ=850 nm light signal emerging from a VCSEL with numerical aperture NA=0.2. It is observe that, similar to the square wave profile design, one can achieve reasonable propagation loss for both TE and TM modes along the air-via.

At the terminating end, the robust effect of the apodized profile on insertion loss is observed: a reduction in reflected power to below 5%. FIGS. 7C-7D and FIGS. 8C-8D show the reflectivity and endpoint transmission observed by light wavevectors traveling with incidence angles θ=11.54°, 0° (i.e. after the 90° orthogonal rotation, incidence angles get re-mapped as 78.46°→11.54°, 90°→0°). With this data there is a complete quantitative model of propagation loss and endpoint transmission, as summarized in FIGS. 9A-9D, for the angles θ=0°, 11.54° bounding the NA=0.2 angular emission range.

The apodized profile partial confinement photonic crystal waveguide, as specified in FIGS. 6A-6B, comprised of 7.5 pairs of $SiON/SiO_2$, will optimally achieve optical isolation/waveguiding of the VCSEL light signal and endpoint transmission into the POF or single mode fiber optic or multimode fiber optic. The propagating states of light available within the air-via are highly multi-mode; the number of propagating modes within air-via depends on the diameter size, which ranges from d=20-70 μm. The mode number is computed by determining the number of standing waves states (states corresponding to β=0) that can exist within the photonic bandgap, and realizing that each one of these standing wave states connects by continuity of a dispersion relation to a propagating state within the air-via (i.e. the defect layer). The number of standing waves states is computed by dividing the photonic bandgap width by the free spectral range of the defect layer, in frequency units:

$$\# \text{ modes} = \frac{bandgap_v}{FSR} = \frac{v_{center} \frac{4\Delta n}{n_{av}}}{\frac{v_p}{2d}} = \frac{8d\Delta n}{\lambda_{center} n_{av}} \quad \text{Eq. 5}$$

where d is the air-via diameter and $\lambda_{center}$ is the center of the stopband ($\lambda_{center}$>850 nm).

The emitting VCSEL light signal will optimally overlap into the lower order modes and carry power, without modal cross-talk, to the frontside photodetector.

Although the present invention has been shown and described with respect to several preferred embodiments thereof, various changes, omissions and additions to the form and detail thereof, may be made therein, without departing from the spirit and scope of the invention.

What is claimed is:

1. An optical waveguide structure comprising:
   an air-via region that receives an optical signal from an optical source;
   a plurality of first photonic crystal cladding regions that are formed on the surface of said air-via region, wherein said photonic crystal cladding regions confines the optical signal within said air-via region and propagates the optical signal along the axial direction while ensuring near complete transmission of said optical signal; and
   a second photonic cladding region being positioned orthogonally to said first photonic crystal cladding regions providing endpoint transmission into an optical fiber structure.

2. The optical waveguide structure of claim 1, wherein said photonic crystal comprises a Bragg cladding.

3. The optical waveguide structure of claim 2, wherein said Bragg grating comprises alternating pairs of $SiON/SiO_2$ or $Si_3N_4SiO_2$.

4. The optical waveguide structure of claim 2, wherein said Bragg grating provides complete reflection for light at incident angles greater than 45° with respect to a normal.

5. The optical waveguide structure of claim 2, wherein said Bragg grating provides complete transmission for light at incident angles less than 45° with respect to the normal.

6. The optical waveguide structure of claim 1, wherein said air-via region comprises a diameter of 20-70 μm.

7. The optical waveguide structure of claim 1, wherein said optical signal comprises a λ=640-860 nm light signal.

8. The optical waveguide structure of claim 1, wherein said photonic crystal cladding is defined using apodization.

9. The optical waveguide structure of claim 1, wherein said optical fiber comprises a plastic optical fiber (POF) or single mode fiber optic or multimode fiber optic.

10. A monolithical optical structure comprising:
    an air-via region that receives an optical signal from an optical source;
    a plurality of first photonic crystal cladding regions that are formed on the surface of said air-via region, wherein said photonic crystal cladding regions confines the optical signal within said air-via region and propagates the optical signal along the axial direction while ensuring near complete transmission of said optical signal; and
    a second photonic cladding region being positioned orthogonally to said first photonic crystal cladding regions providing endpoint transmission into an optical fiber structure.

11. The monolithical optical structure of claim 10, wherein said photonic crystal comprises a Bragg cladding.

12. The monolithical optical structure of claim 11, wherein said Bragg grating comprises alternating pairs of $SiON/SiO_2$ or $Si_3N_4SiO_2$.

13. The monolithical optical structure of claim 11, wherein said Bragg grating provides complete reflection for light at incident angles greater than 45° with respect to a normal.

14. The monolithical optical structure of claim 11, wherein said Bragg grating provides complete transmission for light at incident angles less than 45° with respect to the normal.

15. The monolithical optical structure of claim 10, wherein said air-via region comprises a diameter of 20-70 μm.

16. The monolithical optical structure of claim 10, wherein said optical signal comprises a λ=640-860 nm light signal.

17. The monolithical optical structure of claim 10, wherein said photonic crystal cladding is defined using apodization.

18. The monolithical optical structure of claim 10, wherein said optical fiber comprises a plastic optical fiber (POF) or single mode fiber optic or multimode fiber optic.

19. A method of forming a waveguide structure comprising:
    providing an air-via region that receives an optical signal from an optical source;
    forming a plurality of first photonic crystal cladding regions on the surface of said air-via region, wherein said photonic crystal cladding regions confines the optical signal within said air-via region and propagates the optical signal along the axial direction while ensuring near complete transmission of said optical signal; and
    forming a second photonic cladding region being positioned orthogonally to said first photonic crystal cladding regions providing endpoint transmission into an optical fiber structure.

20. The method of claim 19, wherein said photonic crystal comprises a Bragg cladding.

21. The method of claim 20, wherein said Bragg grating comprises alternating pairs of $SiON/SiO_2$ or $Si_3N_4/SiO_2$.

22. The method of claim 20, wherein said Bragg grating provides complete reflection for light at incident angles greater than 45° with respect to a normal.

23. The method of claim 20, wherein said Bragg grating provides complete transmission for light at incident angles less than 45° with respect to the normal.

24. The method of claim 19, wherein said air-via region comprises a diameter of 20-70 μm.

25. The method of claim 19, wherein said optical signal comprises a λ=640-860 nm light signal.

26. The method of claim 19, wherein said photonic crystal cladding is defined using apodization.

27. The method of claim 19, wherein said optical fiber comprises a plastic optical fiber (POF) or single mode fiber optic or multimode fiber optic.

* * * * *